US005814549A

United States Patent [19]
Wu

[11] Patent Number: 5,814,549
[45] Date of Patent: Sep. 29, 1998

[54] METHOD OF MAKING POROUS-SI CAPACITOR DRAM CELL

[75] Inventor: Shye-Lin Wu, Hsinchu, Taiwan

[73] Assignee: Powerchip Semiconductor Corp., Hsinchu, Taiwan

[21] Appl. No.: 746,858

[22] Filed: Nov. 18, 1996

[51] Int. Cl.[6] .................... H01L 21/20
[52] U.S. Cl. .................... 438/398; 438/255
[58] Field of Search .................... 438/253, 255, 438/396, 398

[56] References Cited

U.S. PATENT DOCUMENTS 5,254,503 10/1993 Kenney .................... 438/398
5,256,587 10/1993 Jun et al. .................... 438/253
5,342,800 8/1994 Jun .................... 438/398

*Primary Examiner*—Tuan H. Nguyen
*Attorney, Agent, or Firm*—Ladas & Parry

[57] ABSTRACT

A method of manufacturing porous-Si capacitors for use in semiconductor memories is disclosed herein. The present invention includes a SOG layer as an etching mask to etch a polysilicon layer to form a porous-Si structure. The etching process is performed to etch a portion of the first conductive layer and to etch away the remaining HSG-Si. Next, the residue SOG layer is removed to define a porous-Si bottom storage. Utilizing the porous-Si structure, the present invention can be used to increase the surface area of the capacitor.

33 Claims, 5 Drawing Sheets

METHOD OF MAKING POROUS-SI CAPACITOR DRAM CELL

FIELD OF THE INVENTION

The present invention relates to semiconductor capacitors, and more specifically, to a method of making a porous-Si capacitor DRAM cell.

BACKGROUND OF THE INVENTION

Semiconductor Dynamic Random Access Memory (DRAM) devices have many memory cells. Indeed, a memory cell is provided for each bit stored by a DRAM device. Each memory cell typically consists of a storage capacitor and an access transistor. Either the source or drain of the access transistor is connected to one terminal of the capacitor. The other side of the transistor and the transistor gate electrode are connected to external connection lines called a bit line and a word line, respectively. The other terminal of the capacitor is connected to a reference voltage. The formation of a DRAM memory cell comprises the formation of a transistor, a capacitor and contacts to external circuits. The capacitor type that has been typically used in DRAM memory cells are planar capacitors, because they are relatively simple to manufacture.

In order to achieve high performance (i.e. high density) DRAM devices, the memory cells must be scaled down in size to the submicrometer range. As the capacity of DRAMs has increased, the sizes of the memory cells have steadily decreased. If planar capacitors are used, as the memory cells decrease in size, the area of the capacitors also decrease, resulting in a reduction of cell capacitance. For very small memory cells, planar capacitors become very difficult to use reliably. Specifically, as the size of the capacitor decreases, the capacitance of the capacitor also decreases and the amount of the charge capable of being stored by the capacitor similarly decreases. This results in the capacitor being very susceptible to α particle interference. Additionally, as the capacitance decreases, the charge held by storage capacitor must be refreshed often. A simple stacked capacitor can not provide sufficient capacitance, even with high dielectric $Ta_2O_5$ as the capacitor insulator.

Prior art approaches to overcoming these problems have resulted in the development of the trench capacitor (see for example U.S. Pat. No. 5,374,580) and the stacked capacitor (see for example U.S. Pat. No. 5,021,357). The trench capacitor has the well known problem of "gated diode leakage," which is the leakage of current resulting in the trench capacitor failing to hold a charge. Reducing the thickness of the dielectric also can improve the capacitance of the capacitor, but this approach is limited because of yield and reliability problems.

A new capacitor over bit line cell with a hemispherical grain (HSG-Si) polysilicon storage node has been developed (see "Capacitor-Over-Bit-Line Cell with Hemispherical Grain Storage Node For 64 Mb Drams", M. Sakao et al., microelectronics research laboratories, NEC Corporation. "A Capacitor-Over-Bit-Line Cell with a Hemispherical Grain Storage Node For 64 Mb Drams", IEDM Tech Dig., December 1990, pp 655–658). The HSG-Si is deposited by low pressure chemical vapor deposition method at the transition temperature from amorphous-Si to polycrystalline-Si. This memory cell provides large storage capacitance by increasing the effective surface area of a simple storage node and is manufactured by optical delineation. The HSG-Si storage node can be fabricated by addition of two process steps, i.e. HSG-Si deposition and a etchback. A HSG-Si electrode node has been proposed (see "New Cylindrical Capacitor Using Hemispherical Grain Si For 256 Mb Drams", H. Watanabe et al., microelectronics research laboratories, NEC Corporation). After the electrode structure is formed, a native-oxide on the electrode surface is removed by a diluted HF solution. HSG-Si appeared on silicon surface by using seeding method as disclosed in the paper of H. Watanabe.

SUMMARY OF THE INVENTION

The present invention thus provides capacitors with an enlarged surface area. The formation of the porous-Si capacitor described herein includes many process steps that are well known in the art.

A first dielectric layer is formed on a substrate, the first dielectric layer can be formed by using suitable material such as borophosphosilicate glass (BPSG) or TEOS-oxide. Next, a second dielectric layer is deposited on the first dielectric layer to serve as an etching barrier for subsequent process. The second dielectric layer is formed of nitride. A contact hole is formed in the first dielectric layer and second dielectric layer by patterning and etching them. A first conductive layer is formed over and in the contact hole and on the second dielectric layer. The first conductive layer is chosen from doped polysilicon or in-situ doped polysilicon. A HemiSpherical Grains silicon (HSG-Si) layer is formed on the first conductive layer with a thickness about 500–1000 angstroms. A slightly etching is used to etch the HSG-Si layer to separate the Si islands. Then a spin on glass (SOG)layer is formed on the HSG-Si. A thermal curing treatment is performed in $N_2$ at 400° C. to reflow the SOG layer. Next, a dry etching is used to etch the SOG layer to expose the top of the HSG-Si. Residual SOG layer is left on the first conductive layer after the etching process. An etching process is performed by using the residual SOG layer as a mask to etch a portion of the first conductive layer and the HSG-Si. The HSG-Si is totally removed during this etching process. The present invention uses the high etching selectivity between SOG layer and polysilicon to create cavities in the first conductive layer. The residual SOG layer is removed by wet etching. A porous-Si capacitor bottom storage node is formed while the residual SOG layer is stripped. A dielectric film is deposited along the surface of the first conductive layers and the nitride layer. Finally, a second conductive layer is deposited over the dielectric film. The second conductive layer provides a top storage electrode.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The formation of the porous-Si capacitor described herein includes many process steps that are well known in the art. For example, the processes of photolithography masking and etching are well known in the art and are used extensively herein without a delated discussion of this well known technology.

In addition, the present invention uses residual SOG layer as an etching mask to form a porous-Si capacitor structure. Further more, the high etching selectivity between SOG and polysilicon (the relative susceptibility is about 100 to 1) is used to form the porous-Si capacitor.

Figure 1:
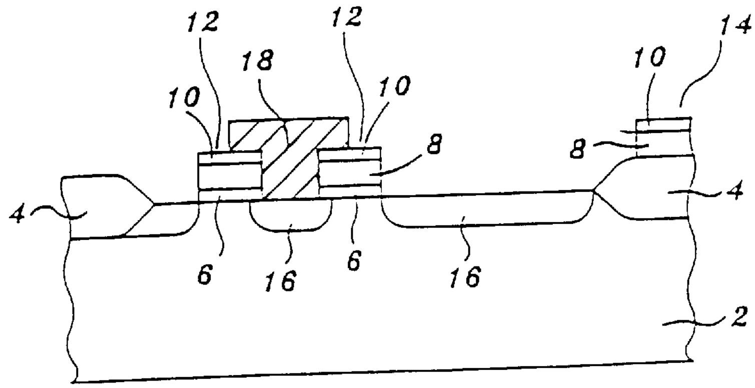
FIG. 1 is a cross section view of a semiconductor wafer illustrating the step of forming a gate structure on a semiconductor substrate.

Referring to FIG. 1, a single crystal silicon substrate 2 with a <100> crystallographic orientation, is provided. A thick field oxide (FOX) region 4 is formed to provide isolation between devices on the substrate 2. The FOX region 4 is created in a conventional manner. For example, the FOX region 4 can be formed via photolithography and dry etching steps to etch a silicon nitride-silicon dioxide composition layer. After the photoresist is removed and wet cleaned, thermal oxidation in an oxygen-steam environment is used to grow the FOX region 4 to a thickness of about 3000–8000 angstroms.

Next, a silicon dioxide layer 6 is created on the top surface of the substrate 2 to serve as the gate oxide for subsequently formed Metal Oxide Silicon Field Effect Transistors (MOSFETs). In one embodiment, the silicon dioxide layer 6 is formed by using an oxygen ambient, at a temperature of about 800° to 1100° C. Alternatively, the oxide layer 6 may be formed using any suitable oxide chemical compositions and procedures. In this embodiment, the thickness of the silicon dioxide layer 6 is approximately 30–200 angstroms.

A doped first polysilicon layer 8 is then formed over the FOX region 4 and the silicon dioxide layer 6 using a Low Pressure Chemical Vapor Deposition (LPCVD) process. In this embodiment, the first polysilicon layer 8 has a thickness of about 500–2000 angstroms. A tungsten silicide layer 10 is formed on the first polysilicon layer 8. Next, standard photolithography and etching steps are used to form a gate structure 12 and a local interconnection 14. Subsequently, active regions 16 (i.e. the source and the drain) are formed by using well known processes to implant appropriate impurities in those regions. Then a metal layer is formed on the substrate 2, A patterning and an etching process is used to etching the metal layer to form a bit line 18.

Figure 2:
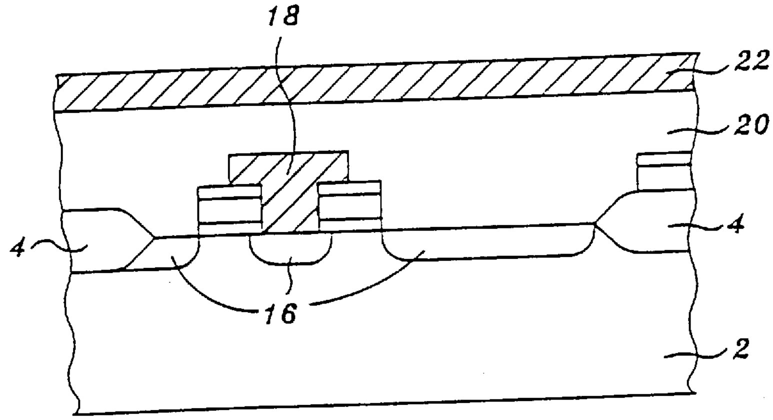
FIG. 2 is a cross section view of a semiconductor wafer illustrating the step of forming a first dielectric layer and a second dielectric layer on the semiconductor substrate.

Turning next to FIG. 2, a first dielectric layer 18 is formed on the gate structure 12, the local interconnection 14, the metal layer 18 and the substrate 2. The first dielectric layer 20 can be formed by using suitable material such as borophosphosilicate glass (BPSG) or TEOS-oxide. The thickness of the first dielectric layer 20 is about 3000–10000 angstroms. Next, a second dielectric layer 22 is deposited on the first dielectric layer to serve as an etching barrier for subsequent process. The second dielectric layer 22 is formed of nitride. The thickness of the second dielectric layer 22 is about 300–2000 angstroms.

Figure 3:
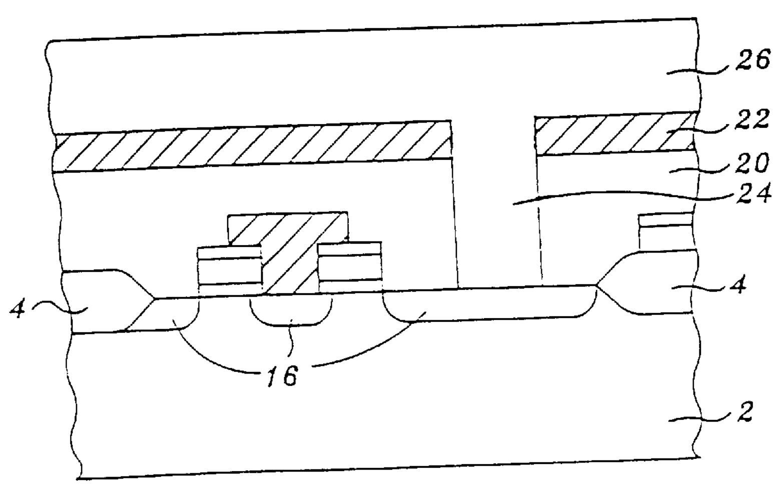
FIG. 3 is a cross section view of a semiconductor wafer illustrating the step of forming a first conductive layer on said second dielectric layer.

As shown in FIG. 3, a contact hole 24 is formed in the first dielectric layer 20 and second dielectric layer 22 by patterning and etching them. A first conductive layer 26 is formed over and in the contact hole 24 and on the second dielectric layer 22. The first conductive layer 26 is preferably formed using conventional LPCVD processing. The thickness of the first conductive layer 26, as measured over the second dielectric layer 22, is optimally 1000–10000 angstroms. The first conductive layer 26 is preferably chosen from doped polysilicon or in-situ doped polysilicon.

Figure 4:
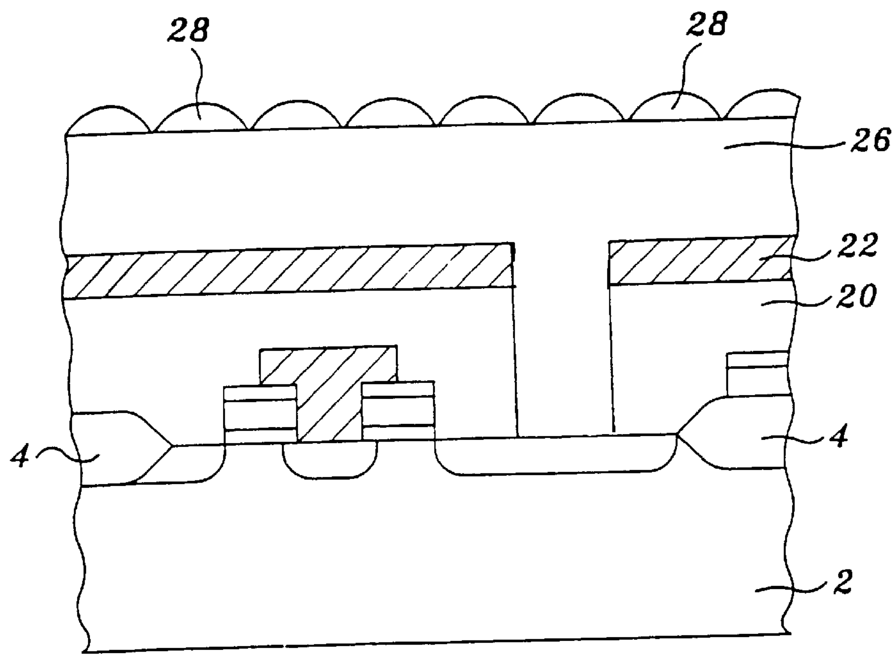
FIG. 4 is a cross section view of a semiconductor wafer illustrating the step of forming a HSG-Si layer on the second dielectric layer.

Turning now to FIG. 4, subsequently, a HemiSpherical Grains silicon (HSG-Si) layer 28 is formed on the first conductive layer 26 with a thickness about 500–1000 angstroms.

Figure 5:
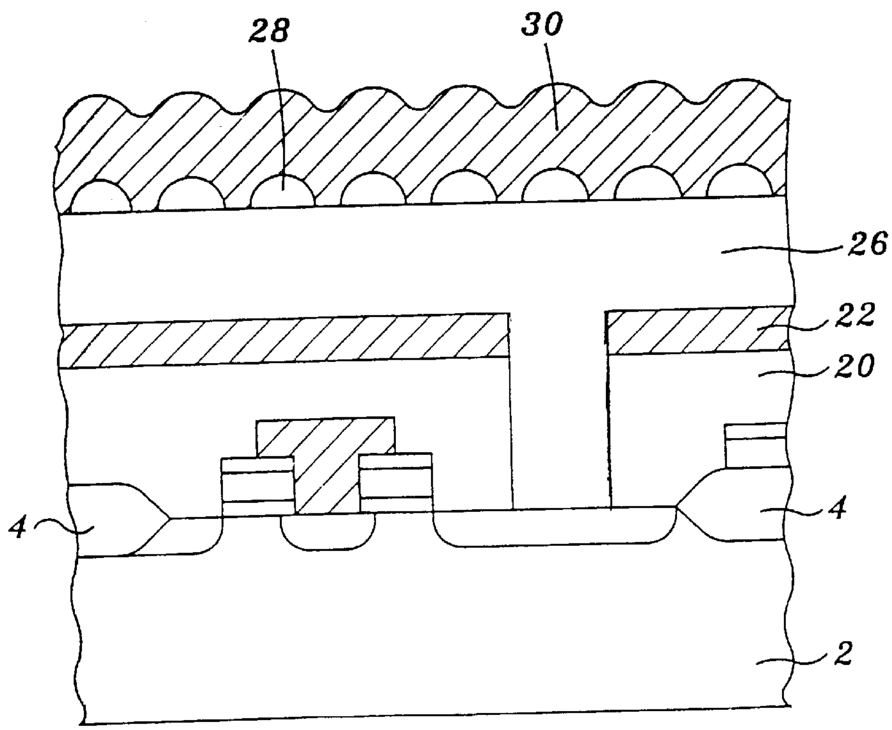
FIG. 5 is a cross section view of a semiconductor wafer illustrating the step of etching the HSG-Si layer to form HSG-Si islands and forming a SOG layer on said HSG-Si islands.
Figure 6:
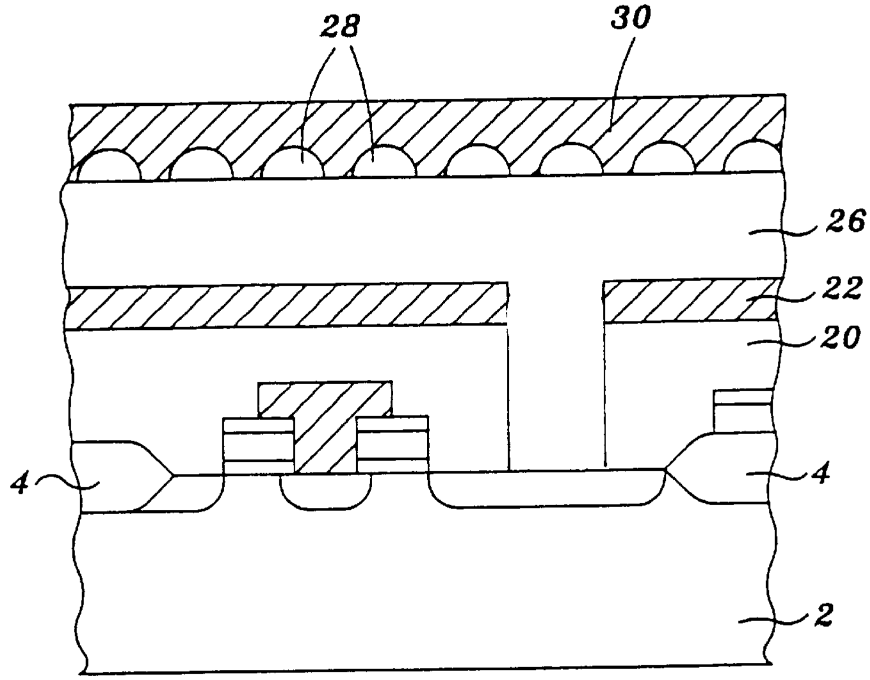
FIG. 6 is a cross section view of a semiconductor wafer illustrating the step of curing SOG layer.

Turning next to FIG. 5, an slighty etching is used to etch the HSG-Si layer 28 to separate Si islands. The etchant of this etching to separate the HSG-Si is chosen from the group of: $HBr/Cl_2/O_2$, $Cl_2$, $HBr/O_2$, $BCl_3/Cl_2$, $SiCl_4/Cl_2$, $SF_6$, $SF_6/Br_2$, $CCl_4/Cl_2$, $CH_3F_3/Cl_2$. Then a spin on glass (SOG) layer 30 is formed on the HSG-Si 28 to have a thickness about 300–2000 angstroms. As seen in FIG. 6, a thermal curing treatment is performed to reflow the SOG layer 30. The temperature of the thermal treatment is about 400° C. The advantage of the SOG layer 30 is that it provides a better topography of planarization.

Figure 7:
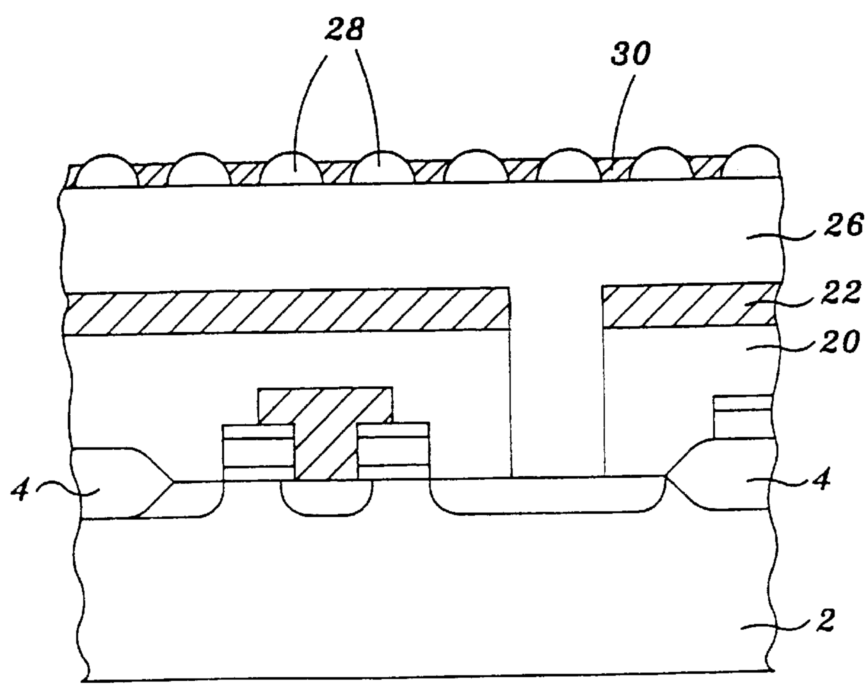
FIG. 7 is a cross section view of a semiconductor wafer illustrating the step of etching the SOG layer.

Next, as seen in FIG. 7, a dry etching is used to etch the SOG layer 30 to expose the top of the HSG-Si 28. The etchant of the etching is selected from the group of $CCl_2F_2$, $CF_4$, $C_2F_6$, $C_3F_8$. Residual SOG layer 30 is left on the first conductive layer 26 after the etching.

Figure 8:
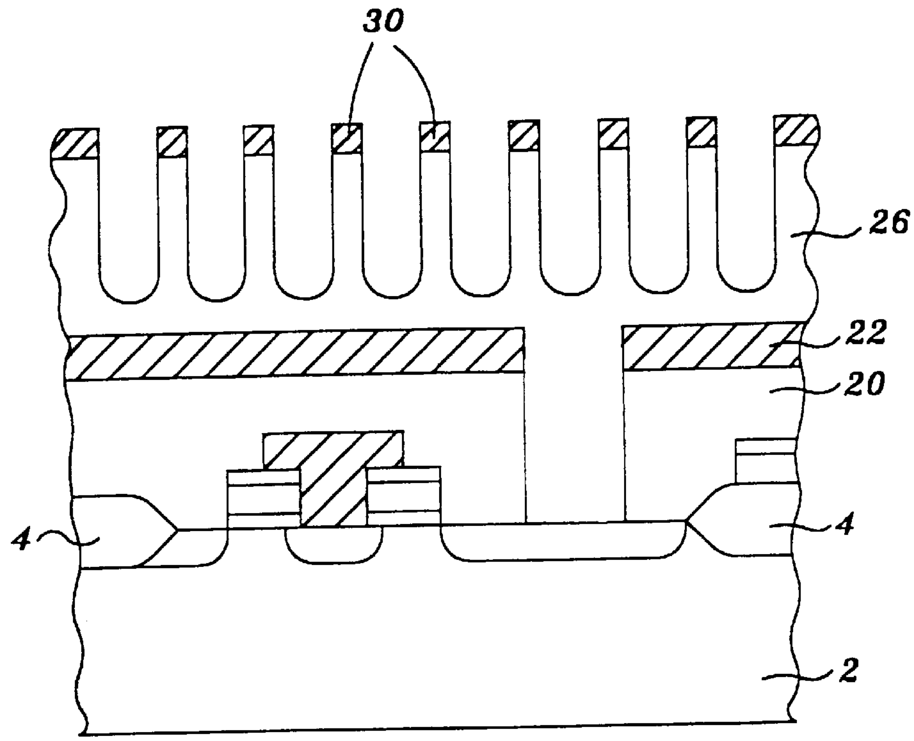
FIG. 8 is a cross section view of a semiconductor wafer illustrating the step of etching a portion of the first conductive layer and the HSG-Si.

As shown in FIG. 8, an etching process is performed by using the residual SOG layer 30 as a mask to etch a portion of the first conductive layer 26 and the HSG-Si 28. Of course, the HSG-Si 28 is totally removed during this etching process. The present invention uses the high etching selectivity between SOG layer 30 and polysilicon 28, 26 to create cavities in the first conductive layer 26. Any suitable etchant can be used for this etching, such as $C_2F_6$, $SF_6$, $CF_4+O_2$, $CF_4+Cl_2$, $CF_4+HBr$, $HBr/Cl_2/O_2$, $Cl_2$, $HBr/O_2$, $BCl_3/Cl_2$, $SiCl_4/Cl_2$, $SF_6$, $SF_6/Br_2$, $CCl_4/Cl_2$, or $CH_3F/Cl_2$.

Figure 9:
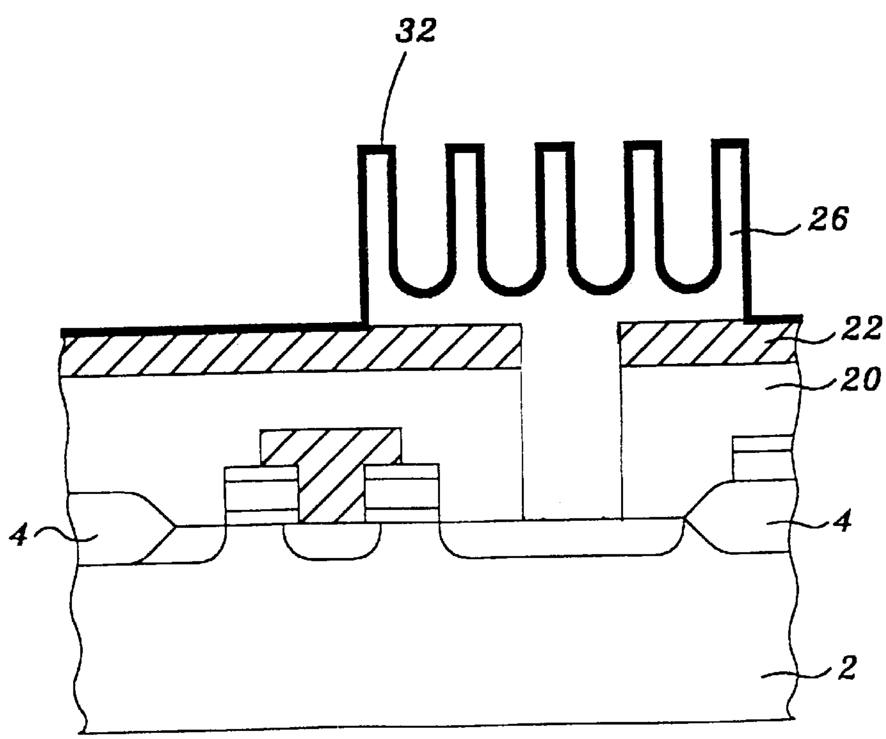
FIG. 9 is a cross section view of a semiconductor wafer illustrating the step of forming a thin dielectric film along the surface of the first conductive layer.
Figure 10:
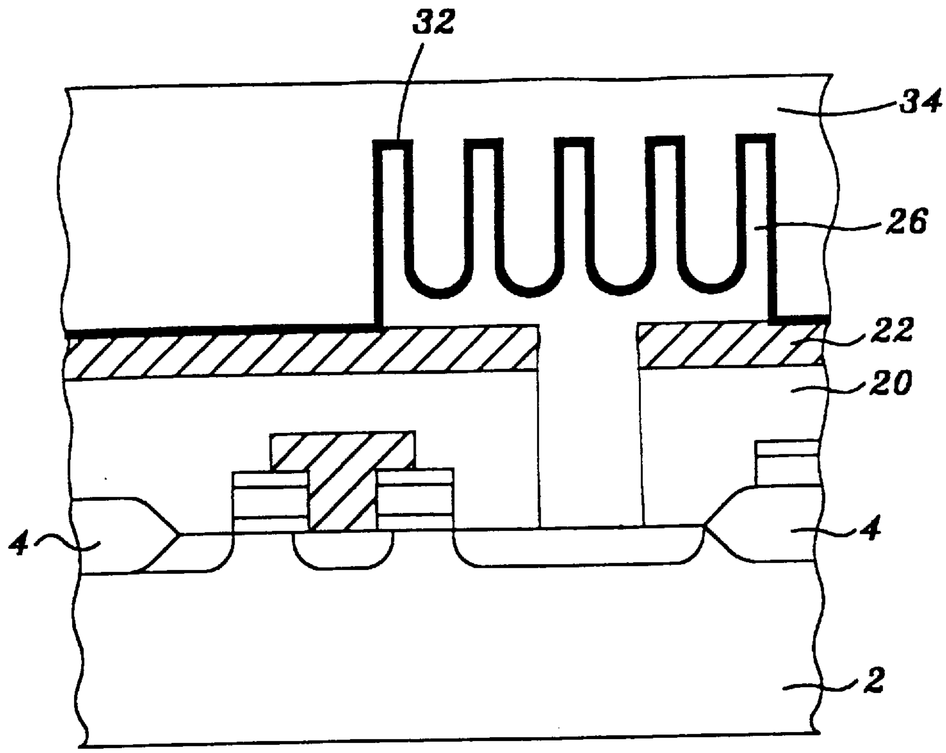
FIG. 10 is a cross section view of a semiconductor wafer illustrating the step of forming a second conductive layer.
Figure 11:
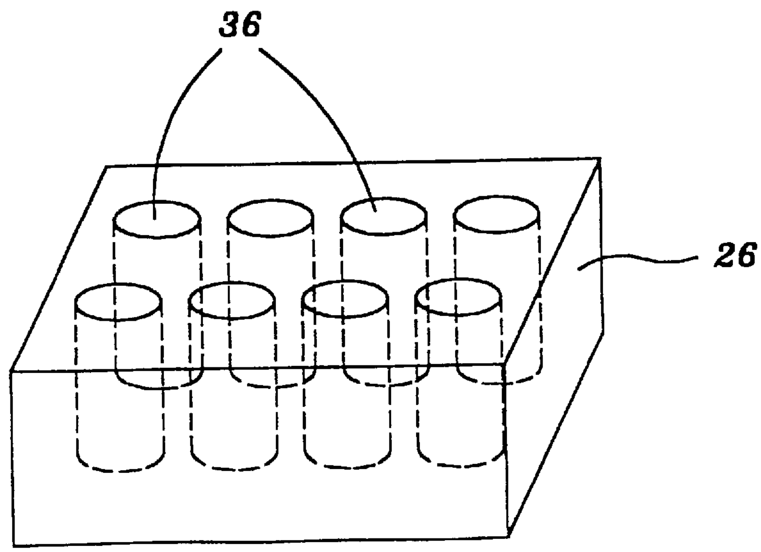
FIG. 11 is a three dimension drawing of a bottom storage node.

Referring to FIG. 9, the residual SOG layer 30 is removed by wet etching. In preferred embodiment, BOE or diluted HF solution is used as an etchant. A porous-Si capacitor bottom storage node is formed while the residual SOG layer 30 is stripped. A photoresist is patterned on the first conductive layer 26. Then a dry etching is used to etch the first conductive layer 26 to the surface of the nitride layer 22 which acts as an etching barrier. A dielectric film 32 is deposited along the surface of the first conductive layers 26 and the nitride layer 22. The dielectric film 32 is preferably formed of either a double-film of nitride/oxide film, a triple-film of oxide/nitride/oxide, or any other high dielectric film such as tantalum oxide($Ta_2O_5$), BST, PZT, PLZT. Finally, as is shown in FIG. 10, a second conductive layer 34 is deposited using a conventional LPCVD process over the dielectric film 32. The second conductive layer 34 provides a top storage electrode and is formed of doped polysilicon, in-situ doped polysilicon, aluminum, copper, tungsten or titanium. Thus, a semiconductor capacitor is formed which comprises a second conductive layer 34 as its top storage electrode, a dielectric 32, and a first conductive layer 26 as the bottom storage electrode. FIG. 11 shows the three dimension drawing of the porous-Si bottom storage node. It can be seen, a plurality of micro-hole 36 are created in the first polysilicon layer 26.

The present invention thus provides capacitors with an enlarged surface area. The present invention uses the high etching selectivity between SOG and polysilicon to fabricate the capacitor. Moreover, the structure increases the surface area of the capacitor. Therefore the present invention increases the performance of the capacitor.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing a porous-Si capacitor on a semiconductor substrate, said substrate having transistors formed in said semiconductor substrate, the method comprising the steps of:

forming a first dielectric layer on said semiconductor substrate;

forming a second dielectric layer on said first dielectric layer;

etching said first dielectric layer and said second dielectric layer to define a contact hole therein;

forming a first polysilicon layer on said second dielectric layer and in said contact hole;

forming a HSG-Si layer on said first polysilicon layer;

etching said HSG-Si layer to form separated HSG-Si islands;

forming a SOG layer on said HSG-Si and said first polysilicon layer;

performing a thermal curing treatment to reflow said SOG layer;

etching said SOG layer to expose the top of said HSG-Si islands leaving a residual SOG layer on said first polysilicon layer;

using said residual SOG layer as a mask to etch a portion of said polysilicon layer and said HSG-Si islands to form a plurality of cavities in said first polysilicon layer, said HSG-Si islands being completely removed by said etch;

removing said residual SOG layer to define a porous-Si structure;

patterning a photoresist on said porous-Si structure;

etching said porous-Si structure to the surface of said second dielectric layer;

forming a dielectric film on the surface of said porous-Si structure and said second dielectric layer; and forming a second polysilicon layer over said dielectric film to form a porous-Si capacitor.

2. The method of claim 1, wherein said first dielectric layer comprises TEOS-oxide.

3. The method of claim 1, wherein said first dielectric layer comprises BPSG.

4. The method of claim 1, wherein said second dielectric layer comprises nitride.

5. The method of claim 4, wherein said nitride has a thickness in a range of about 300–2000 angstroms.

6. The method of claim 1, wherein said first polysilicon layer has a thickness in a range of about 1000–10000 angstroms.

7. The method of claim 6, wherein said first polysilicon layer is chosen from the group of doped polysilicon or in-situ doped polysilicon.

8. The method of claim 1, wherein the etchant of said etch to etch said HSG-Si islands is chosen from the group of $HBr/Cl_2/O_2$, $Cl_2$, $HBr/O_2$, $BCl_3/Cl_2$, $SiCl_4/Cl_2$, $SF_6$, $SF_6/Br_2$, $CCl_4/Cl_2$, $CH_3F/Cl_2$.

9. The method of claim 1, wherein said HSG-Si layer is formed to have a thickness of a range about 300–2000 angstroms.

10. The method of claim 1, wherein said SOG layer is formed to have a thickness of a range about 300–2000 angstroms.

11. The method of claim 1, wherein the etchant of said etch to etch a portion of said polysilicon layer and said HSG-Si by using said SOG as a mask is chosen from the group of $C_2F_6$, $SF_6$, $CF_4+O_2$, $CF_4+Cl_2$, $CF_4$+HBr, $HBr/Cl_2/O_2$, $Cl_2$, $HBr/O_2$, $BCl_3/Cl_2$, $SiCl_4/Cl_2$, $SF_6$, $SF_6/Br_2$, $CCl_4/Cl_2$, or $CH_3F/Cl_2$.

12. The method of claim 1, wherein said dielectric film is formed of tantalum oxide($Ta_2O_5$), BST or PZT.

13. The method of claim 1, wherein said dielectric film is formed of a triple film of oxide/nitride/oxide.

14. The method of claim 1, wherein said dielectric film is formed of a double film of nitride/oxide film.

15. The method of claim 1, wherein said second polysilicon layer is selected from the group of doped polysilicon, in-situ doped polysilicon.

16. A method of forming a porous-Si structure, said method comprising the steps of:

forming a polysilicon layer over a semiconductor substrate;

forming a HSG-Si layer on said polysilicon layer;

etching said HSG-Si layer to form separated HSG-Si islands;

forming a SOG layer on said HSG-Si and said polysilicon layer;

performing a thermal curing treatment to reflow said SOG layer;

etching said SOG layer to expose the top of said HSG-Si islands leaving a residual SOG layer on said polysilicon layer;

using said residual SOG layer as a mask to etch a portion of said polysilicon layer and said HSG-Si islands to form a plurality of cavities in said polysilicon layer, said HSG-Si islands being completely removed by said etch;

removing said residual SOG layer to define a porous-Si structure.

17. The method of claim 16, wherein said polysilicon layer is chosen from the group of doped polysilicon or in-situ doped polysilicon.

18. The method of claim 16, wherein the etchant of said etch to etch said HSG-Si islands is chosen from the group of $HBr/Cl_2/O_2$, $Cl_2$, $HBr/O_2$, $BCl_3/Cl_2$,$SiCl_4/Cl_2$, $SF_6$, $SF_6/Br_2$, $CCl_4/Cl_2$, $CH_3F/Cl_2$.

19. The method of claim 16, wherein the etchant of said etch to etch a portion of said polysilicon layer and said HSG-Si by using said SOG as a mask is chosen from the group of $C_2F_6$, $SF_6$, $CF_4$+$O_2$, $CF_4$+$Cl_2$, $CF_4$+HBr, $HBr/Cl_2/O_2$, $Cl_2$, $HBr/O_2$, $BCl_3/Cl_2$, $SiCl_4/Cl_2$, $SF_6$, $SF_6/Br_2$, $CCl_4/Cl_2$, or $CH_3F/Cl_2$.

20. A method for manufacturing a porous-Si capacitor (PSC) on a semiconductor substrate, said semiconductor substrate having transistors formed in said semiconductor substrate, the method comprising the steps of:

forming a BPSG layer on said semiconductor substrate;

forming a nitride layer on said BPSG layer;

etching said BPSG layer and said nitride layer to define a contact hole therein;

forming a first polysilicon layer on said nitride layer and in said contact hole;

forming a HSG-Si layer on said first polysilicon layer;

etching said HSG-Si layer to form separated HSG-Si islands;

forming a SOG layer on said HSG-Si and said first polysilicon layer;

performing a thermal curing treatment to reflow said SOG layer;

etching said SOG layer to expose the top of said HSG-Si islands leaving a residual SOG layer on said first polysilicon layer;

using said residual SOG layer as a mask to etch a portion of said polysilicon layer and said HSG-Si islands to form a plurality of cavities in said first polysilicon layer, said HSG-Si islands being completely removed by said etch;

removing said residual SOG layer to define a porous-Si structure;

patterning a photoresist on said porous-Si structure;

etching said porous-Si structure to the surface of said nitride layer;

forming a dielectric film on the surface of said porous-Si structure and said nitride layer; and forming a second polysilicon layer over said dielectric film to form a porous-Si capacitor.

21. The method of claim 20, wherein said first polysilicon layer and second polysilicon layer are chosen from the group of doped polysilicon or in-situ doped polysilicon.

22. The method of claim 20, wherein the etchant of said etch to etch said HSG-Si islands is chosen from the group of $HBr/Cl_2/O_2$, $Cl_2$, $HBr/O_2$, $BCl_3/Cl_2$, $SiCl_4/Cl_2$, $SF_6$, $SF_6/Br_2$, $CCl_4/Cl_2$, $CH_3F/Cl_2$.

23. The method of claim 20, wherein the etchant of said etch to etch a portion of said polysilicon layer and said HSG-Si by using said SOG as a mask is chosen from the group of $C_2F_6$, $SF_6$, $CF_4$+$O_2$, $CF_4$+$Cl_2$, $CF_4$+HBr, $HBr/Cl_2/O_2$, $Cl_2$, $HBr/O_2$, $BCl_3/Cl_2$, $SiCl_4/Cl_2$, $SF_6$, $SF_6/Br_2$, $CCl_4/Cl_2$, or $CH_3F/Cl_2$.

24. The method of claim 20, wherein said dielectric film is formed of tantalum oxide($Ta_2O_5$), BST or PZT.

25. The method of claim 20, wherein said dielectric film is formed of a triple film of oxide/nitride/oxide.

26. The method of claim 20, wherein said dielectric film is formed of a double film of nitride/oxide film.

27. A method for manufacturing a porous-Si capacitor on a semiconductor substrate, said semiconductor substrate having transistors formed in said semiconductor substrate, the method comprising the steps of:

forming a TEOS-oxide layer on said semiconductor substrate;

forming a nitride layer on said TEOS-oxide layer;

etching said TEOS-oxide layer and said nitride layer to define a contact hole therein;

forming a first polysilicon layer on said nitride layer and in said contact hole;

forming a HSG-Si layer on said first polysilicon layer;

etching said HSG-Si layer to form separated HSG-Si islands;

forming a SOG layer on said HSG-Si and said first polysilicon layer;

performing a thermal curing treatment to reflow said SOG layer;

etching said SOG layer to expose the top of said HSG-Si islands leaving a residual SOG layer on said first polysilicon layer;

using said residual SOG layer as a mask to etch a portion of said polysilicon layer and said HSG-Si islands to form a plurality of cavities in said first polysilicon layer, said HSG-Si islands being completely removed by said etch;

removing said residual SOG layer to define a porous-Si structure;

patterning a photoresist on said porous-Si structure;

etching said porous-Si structure to the surface of said nitride layer;

forming a dielectric film on the surface of said porous-Si structure and said nitride layer; and forming a second polysilicon layer over said dielectric film to form a porous-Si capacitor.

28. The method of claim 27, wherein said first polysilicon layer and second polysilicon layer are chosen from the group of doped polysilicon or in-situ doped polysilicon.

29. The method of claim 27, wherein the etchant of said etch to etch said HSG-Si islands is chosen from the group of $HBr/Cl_2/O_2$, $Cl_2$, $HBr/O_2$, $BCl_3/Cl_2$,$SiCl_4/Cl_2$, $SF_6$, $SF_6/Br_2$, $CCl_4/Cl_2$, $CH_3F/Cl_2$.

30. The method of claim 27, wherein the etchant of said etch to etch a portion of said polysilicon layer and said HSG-Si by using said SOG as a mask is chosen from the group of $C_2F_6$, $SF_6$, $CF_4$+$O_2$, $CF_4$+$Cl_2$, $CF_4$+HBr, $HBr/Cl_2/O_2$, $Cl_2$, $HBr/O_2$, $BCl_3/Cl_2$, $SiCl_4/Cl_2$, $SF_6$, $SF_6/Br_2$, $CCl_4/Cl_2$ or $CH_3F/Cl_2$.

31. The method of claim 27, wherein said dielectric film is formed of tantalum oxide($Ta_2O_5$), BST or PZT.

32. The method of claim 27, wherein said dielectric film is formed of a triple film of oxide/nitride/oxide.

33. The method of claim 27, wherein said dielectric film is formed of a double film of nitride/oxide film.

* * * * *